(12) United States Patent
Whitmore

(10) Patent No.: US 11,105,001 B2
(45) Date of Patent: Aug. 31, 2021

(54) CATHODIC CORROSION PROTECTION WITH SOLAR PANEL

(71) Applicant: David William Whitmore, Winnipeg (CA)

(72) Inventor: David William Whitmore, Winnipeg (CA)

(*) Notice: Subject to any disclaimer, the term of this patent is extended or adjusted under 35 U.S.C. 154(b) by 620 days.

(21) Appl. No.: 15/695,515

(22) Filed: Sep. 5, 2017

(65) Prior Publication Data
US 2019/0071782 A1 Mar. 7, 2019

(51) Int. Cl.
| | | |
|---|---|---|
| *C23F 13/20* | (2006.01) | |
| *H01L 31/02* | (2006.01) | |
| *H02S 40/34* | (2014.01) | |
| *H02S 40/38* | (2014.01) | |
| *H01L 31/0392* | (2006.01) | |
| *C23F 13/10* | (2006.01) | |
| *C23F 13/04* | (2006.01) | |
| *C23F 13/18* | (2006.01) | |
| *H02S 50/10* | (2014.01) | |
| *H02S 20/00* | (2014.01) | |

(52) U.S. Cl.
CPC .............. *C23F 13/20* (2013.01); *C23F 13/04* (2013.01); *C23F 13/10* (2013.01); *C23F 13/18* (2013.01); *H01L 31/02013* (2013.01); *H01L 31/03926* (2013.01); *H02S 20/00* (2013.01); *H02S 40/34* (2014.12); *H02S 40/38* (2014.12); *H02S 50/10* (2014.12); *C23F 2201/02* (2013.01)

(58) Field of Classification Search
CPC .......... C23F 13/02; C23F 13/04; C23F 13/06; C23F 13/08; C23F 13/10; C23F 13/20; C23F 13/22; C23F 2201/02; C23F 2213/10; C23F 2213/20; C23F 2213/21; C23F 2213/30
See application file for complete search history.

(56) References Cited

U.S. PATENT DOCUMENTS 4,306,189 A * 12/1981 Nozaki ................... C23F 13/22
324/425
5,026,468 A 6/1991 Carpenter et al.
(Continued)

FOREIGN PATENT DOCUMENTS

CA 2991567 7/2018
DE 19818343 3/2000
(Continued)

*Primary Examiner* — Alexander W Keeling
(74) *Attorney, Agent, or Firm* — Adrian D. Battison; Ryan W. Dupuis; Ade & Company Inc.

(57) ABSTRACT

A metal section in concrete or mortar material is protected against corrosion by providing an anode and a solar panel where the solar panel and the anode are supplied for installation as a common unit where the anode is mounted to the rear of the solar panel with an optional storage component therebetween. At least a part of the anode is attached to a surface of the material and one or both of the anode and the solar panel is flexible to conform to the surface. In installation, a light meter is used to determine levels of ambient light for example in an interior location not in receipt of direct sunlight and details of the material and metal section at the location to calculate a required location and size of the solar panels and the anodes.

13 Claims, 4 Drawing Sheets

(56) References Cited

U.S. PATENT DOCUMENTS

| | | | | |
|---|---|---|---|---|
| 2012/0018312 A1* | 1/2012 | Yamamoto | ............... | C09D 5/24 |
| | | | | 205/724 |
| 2014/0021063 A1* | 1/2014 | Sergi | ....................... | C23F 13/20 |
| | | | | 205/730 |
| 2015/0090607 A1* | 4/2015 | Galande | ................. | C23F 13/06 |
| | | | | 205/724 |

FOREIGN PATENT DOCUMENTS

| | | | | |
|---|---|---|---|---|
| DE | 19818343 C1 * | 3/2000 | .............. | C23F 13/04 |
| DE | 10007850 | 8/2001 | | |
| EP | 1318247 A1 * | 6/2003 | .............. | C23F 13/16 |
| WO | 2017075699 | 5/2017 | | |

* cited by examiner

CATHODIC CORROSION PROTECTION WITH SOLAR PANEL

This invention relates to a method and/or an anode assembly for cathodically protecting and/or passivating a metal section in am material which is an ionically conductive concrete or mortar material using a solar panel to provide a voltage.

BACKGROUND OF THE INVENTION

Solar panels have been used for providing voltage to an array of anodes in a cathodic protection system for example as shown in US Patent document H1644 published May 6, 1997. In most cases the solar panel or panels are mounted on a stand at a required angle to efficiently receive sunlight and this array of panels provides voltage to power an array of anodes in the area of the metal to be protected.

SUMMARY OF THE INVENTION

According to one aspect of the invention there is provided a method for cathodically protecting and/or passivating a metal section in a material which is an ionically conductive concrete or mortar, comprising:

providing an anode for communication of an ionic current to the metal section in the material;

providing a solar panel having two terminals and arranging the solar panel so as to generate a voltage across the terminals in response to incident light thereon;

engaging the anode with the material;

connecting one terminal of the solar panel directly or indirectly to the anode and the other terminal directly or indirectly to the metal section such that corrosion of the metal section is reduced or halted;

wherein the solar panel and the anode are supplied for installation as a common unit.

According to another aspect of the invention there is provided a method for cathodically protecting and/or passivating a metal section in a material which is an ionically conductive concrete or mortar, comprising:

providing an anode for communication of an ionic current to the metal section in the material;

providing a solar panel having two terminals and arranging the solar panel so as to generate a voltage across the terminals in response to incident light thereon;

engaging the anode with the material;

connecting one terminal of the solar panel directly or indirectly to the anode and the other terminal directly or indirectly to the metal section;

wherein at least a part of the anode is attached to a surface of the material.

According to another aspect of the invention there is provided a method for cathodically protecting and/or passivating a metal section in a material which is an ionically conductive concrete or mortar, comprising:

providing an anode for communication of an ionic current to the metal section in the material;

providing a solar panel having two terminals and arranging the solar panel so as to generate a voltage across the terminals in response to incident light thereon;

engaging the anode with the material;

connecting one terminal of the solar panel directly or indirectly to the anode and the other terminal directly or indirectly to the metal section;

and wherein at least one of the anode and the solar panel is flexible.

According to another aspect of the invention there is provided a method for cathodically protecting and/or passivating a metal section in a material which is an ionically conductive concrete or mortar, comprising:

providing an anode for communication of an ionic current to the metal section in the material;

providing a solar panel having two terminals and arranging the solar panel so as to generate a voltage across the terminals in response to incident light thereon;

engaging the anode with the material;

connecting one terminal of the solar panel directly or indirectly to the anode and the other terminal directly or indirectly to the metal section such that corrosion of the metal section is reduced or halted;

using a light meter to determine levels of ambient light in a location on the material;

and using details of the material and metal section at the location to calculate a required location and size of the solar panels and the anodes.

The arrangement herein is primarily provided for protection of a material which comprises concrete or mortar and is particularly concerned with protection of steel reinforcement in the material, although other metal sections in contact with the material and thus subject to corrosion may also be protected. The concrete or mortar material thus has a surface which is set to a required shape which may include planar sections but typically has surfaces connected at corners which are non-planar such as edges of a bridge deck or sides of columns and the like.

In a preferred arrangement, in the common unit, one terminal of the solar panel is already connected to the anode in an initial manufacturing step so that the unit is ready for installation on site. In other arrangements, the connections can be applied at the installation site. Thus in the present invention, all of the components can be assembled and put into operation at the field or installation site. However more preferably the anode and solar panel are assembled as a common unit in a prior manufacturing location.

In a preferred method at least a part of the anode and in some cases all of the anode lies along and is connected to a rear surface of the solar panel. The connection can be directly attached either by simply a layer of an adhesive material or there may be intervening components so that the anode is indirectly attached to the solar panel.

Where the anode and solar panel are connected together, preferably the solar panel and the anode are both flexible so that the assembled construction is itself flexible and can conform to non-planar surfaces to which the assembly is attached.

This allows the installation step, where necessary to include flexing of the solar panel and the anode to conform to a non-planar surface of the material and attaching of the anode to the surface.

Preferably the exposed surface of the anode is attached to the surface of the material by an ionically or electrically conductive adhesive material. This can be a layer of mortar in which the anode surface is impressed or it can be a conductive layer of an adhesive material such as an adhesive supplemented by conductive material such as carbon.

That is the components can be assembled to make the combined unit in the field, or at the installation site. The combined unit can be pre-made or partially premade and can be connected to additional anode material in the field. The electrical connector for connecting the solar panel to the metal section can be connected in the field. The electrical connection of the unit to the material or structure to be protected must be made in the field.

Where the anode is not attached to the solar panel in the initial unit as supplied, at least a part of the anode can be attached to or applied to a surface of the material. The anode can be provided as an impressed current anode or of a sacrificial material which is more electronegative than the reinforcing steel. Thus the anode may comprise:

A conductive coating

A conductive mastic

Arc spray zinc, or other sacrificial materials.

Arc spray titanium or other non-corroding materials

MMO coated titanium. This can be supplied as a ribbon, mesh, foil, tube, rod, wire, etc.

Platinum which may be coated.

Niobium

Graphite, carbon

A body of Zinc, or other sacrificial materials.

The unit including the anode and solar panel may be self-adhesive by including a layer of a suitable adhesive material covered by a removable protective layer.

The unit may also be installed with a separately applied layer of an adhesive, mortar or other ionically conductive material.

The unit may be affixed using electrically conductive coating/mastic operating as both the adhesive and the anode. This anode material may be the complete anode or can be additional to anode material which is already part of the unit. That is the unit may include a first anode component formed by an anode body attached to the solar panel together with additional material in the form for example of MMO coated titanium ribbon or mesh, or niobium coated copper wire.

This additional anode material therefore may extend beyond a perimeter of the solar panel. That is the part on the anode may be embedded in or attached to a wider or larger body of anode material attached as a separate step to the surface of the material. That is the solar panels may cover some or all of the surface area provided by the anode so that the anode may extend beyond the area covered by solar panels. Alternatively, the anode may cover some or all of the solar panel area so that the anode may form only a part of the rear surface of the solar panel.

That is, in addition to the part of the anode connected to or applied to the surface there can be provided an additional anode component. This can be an anode element embedded or buried in the concrete material or it can be an additional component applied to the surface.

In another possible arrangement, the additional anode component comprises a sacrificial anode member arranged to supply voltage when the solar panel is not active. This component can preferably be buried in the material or may be another surface component. Typically the sacrificial anode component is buried in material either directly at the same location as the surface anode it is may be in a different excavation spaced to one side of the metal section to be protected.

In some cases the solar panels are designed for use in sunlight so that the voltage obtained in high illumination conditions is arranged to provide sufficient voltage and current to meet the protection requirements of the installation. In this case there may be provided a storage device as part of the common unit. This can be a cell or a capacitor. Where at least a part of the anode lies along and is directly or indirectly connected to a rear surface of the solar panel, preferably the storage device is located between the anode and the solar panel. That is the unit may include an energy storage device such as a rechargeable battery or capacitor or supercapacitor. The surface of the battery can be the anode or the storage device may be a separate component not directly connected to the anode.

In the exterior installation in sunlight, where the voltage and current will dramatically rise and fall, it is also possible to use the above mentioned additional sacrificial anode section to provide the back-up voltage and current where the solar voltage drops below acceptable levels.

In another embodiment, the solar panel can be selected and arranged to generate sufficient voltage and current to cathodically protect and/or passivate said metal section at low light much lower than that available from sunlight such as values less than 1000 lux, 500 lux or 200 lux. These values can be typically obtained in an artificially lit but interior location or an indoor location without access to direct sunlight. Such conditions may arise in a parking garage or the like where there is no direct sunlight and can often occur on other structures when daylight falls to low levels and an interior lighting system maintains lighting values sufficient to guide the user. It has been found that such low level illumination can provide sufficient light for suitably selected low light solar panels. These interior lighting systems provide illumination values at the above low levels which are not subject to the high variations obtained with direct sunlight.

This embodiment is particularly effectively installed with the steps of using a light meter to determine levels of ambient light in a location on the material and using details of the material and metal section at the location to calculate a required location and size of the solar panels and the anodes.

The light meter is used to collect light intensity data in the area to be protected. The structural data includes the position and content of the reinforcing steel, the concrete condition, the corrosion condition of the steel and the desired level of future corrosion protection. These criteria are used to determine the location, number and size of solar panel or panels, the type and size of anode or anodes required and the number and size of energy storage devices if desired.

The method includes positioning and installing the solar panel or panels, the anode material, the energy storage device if desired and the connections to steel to be protected together with optionally monitoring the performance of the system. The performance of the system may be monitored to confirm the system is performing properly. Performance may be monitored manually or preferably the performance is monitored automatically without the need to take monitoring equipment to the installation site and without the need to disconnect the unit as this creates a situation where the unit may be left disconnected from the metal section when monitoring is complete. A preferred performance indicator is an LED light which is powered when the system is on. The light may be on at all times when the system is operational or the light may be connected to a test circuit such that the light is normally off, but is turned on during a test if the system is operational at that time.

The solar panel/anode assembly unit may include a diode to prevent current from flowing in the reverse direction due to the difference in potential between the anode and the reinforcing steel, particularly where the anode is an inert anode or non-sacrificial anode.

Thus one embodiment described above provides the anode and solar panel as an integral structure where the anode is applied to the rear surface of the panel. This locates the solar panel at an angle which is determined by the angle of the surface of the material and not determined by the position of the sun. This combined unit can then be flexible to allow the unit to conform to non-planar surfaces. This conformation can take the form of minor deviations to match imperfections in the surface or can be major changes in angle such as when the unit is applied adjacent a corner or a curvature in a body to be protected. In this case the whole unit including the solar panel and the anode may be bent around the corner. Alternatively the anode can have a much larger surface area than the solar panel even though these are attached and overlie. In this case the anode can be wrapped or applied around the corner to supply the current to the surface of the material at the best location for the metal to be protected while the solar panel is located on a surface of the material best suited for light reception.

The arrangement herein can also use a support member or bracket which carries the solar panel relative to the anode at an angle so that the anode can lie on the surface of the concrete at the angle determined thereby while the solar panel is supported at the best angle for the incident illumination. The bracket may be adjustable to change the angle. The solar panel, bracket and anode form a common unit by which the anode is applied to the surface in a manner to hold the bracket and the solar panel spaced from the surface.

Preferably the storage component when used is connected as a single unit with an impressed current or non-sacrificial anode and/or with a sacrificial anode. In this arrangement preferably the storage component is contained within a closed or sealed unit defining the anode on an exterior surface. In this case the anode can be formed of stainless steel or MMO coated titanium or other suitable material The above features can be preferably used for protection of steel reinforcing or structural members in concrete or mortar material where it is well known that corrosion can cause breakdown of the concrete due to the expansive forces of the corrosion products and due to the reduction to the steel strength. However uses in other situations can arise.

The term impressed current anode used herein is intended to distinguish from the sacrificial anode where the sacrificial anode is formed of a material, typically of zinc, which is less noble than the metal section so that it preferentially corrodes relative to the metal section to be protected. The impressed current anode is one which is used in conjunction with an external power supply and does not need to be less noble than the metal section. Typically such impressed current anodes are formed of titanium, platinum, niobium, carbon and other noble metals and oxides which do not corrode readily, or they can be formed of iron or less noble materials such as zinc.

For use during a sacrificial or galvanic phase of operation of the above method, the ionically conductive filler material preferably contains at least one activator to ensure continued corrosion of the sacrificial anode. However the activator can also be located at other positions in the system. Suitable filler materials can be in the form of solids, gels or liquids.

Gels can include carbomethyl cellulose, starches and their derivatives, fumed silica or polymer gel electrolytes, e.g. acrylic acid in a potassium hydroxide solution or polyvinyl chloride/acetate-KOH composites with additions of bentonite, propylene carbonate and or alumina. The alkali hydroxide in these gels acts as a suitable activator.

Suitable activators include alkali hydroxides, humectants, catalytic materials and other materials which are corrosive to the sacrificial anode metal. Activators may be used alone or in combination.

For use during a sacrificial or galvanic phase of operation of the above method, the ionically conductive filler material preferably has a pH sufficiently high for corrosion of the sacrificial anode to occur and for passive film formation on the sacrificial anode to be avoided. Alternatively, the filler may have a lower pH and/or contain other activators for corrosion of the sacrificial anode to occur and for passive film formation on the sacrificial anode to be avoided.

The anode and methods herein are preferably designed for use where the metal section is steel and the ionically conductive material is concrete or mortar.

The anode apparatus including the impressed current and sacrificial components is typically buried in the concrete or other solid material so that it is fully encased by the concrete or a filler material, but this is not essential and the anode may be only partially buried or in direct or indirect physical or ionic contact with the concrete.

The anode apparatus including the impressed current and sacrificial components may be surrounded by an encapsulating material or ionically conducting filler material which may be a porous material or porous mortar material. Suitable encapsulating materials can be inorganic or organic and may be any ionically conductive cementitious, polymer or non-cementitious material or mortar including geopolymers or modified Portland cements. The encapsulating material may be solid, gel or liquid and may be deformable.

The construction and methods proposed herein are designed particularly where the metal section is steel and the ionically conductive material is concrete or mortar. However the same arrangements may be used in other corrosion protection systems such as for pipes or other constructions in soil, and in many other systems where such anodes can be used.

Preferably the assembly includes a reinforcing layer, such as disclosed in U.S. Pat. No. 7,226,532 issued Jun. 5, 2007 to Whitmore, the disclosure of which is incorporated by reference or to which reference may be made for further details not disclosed herein, to restrain and resist forces such as expansion, contraction and deformation forces which may be caused by corrosion of the anodes, deposition of sacrificial anode ions and other physical/environmental forces such as freezing, thawing, wetting, drying and thermal expansion/contraction.

The invention as defined and described herein can also be provided as an assembly, as opposed to a method for cathodically protecting and/or passivating a metal section in an ionically conductive material. Each of these independent definitions can be used in conjunction with any one of or all of the subsidiary features as defined above.

BRIEF DESCRIPTION OF THE DRAWINGS

Embodiments of the invention will now be described in conjunction with the accompanying drawings in which.

In the drawings like characters of reference indicate corresponding parts in the different figures.

DETAILED DESCRIPTION

Figure 1:
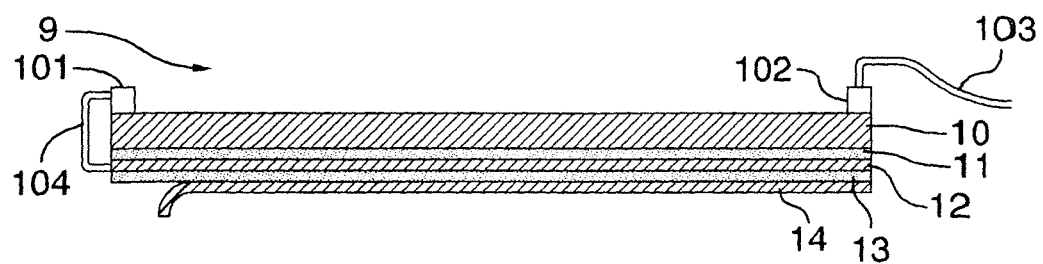
FIG. 1 is a cross-sectional view of a first anode assembly for use on a concrete reinforced structure in a corrosion protection method according to the present invention, the anode assembly being separate from the concrete structure on which it is to be installed.
Figure 1A:
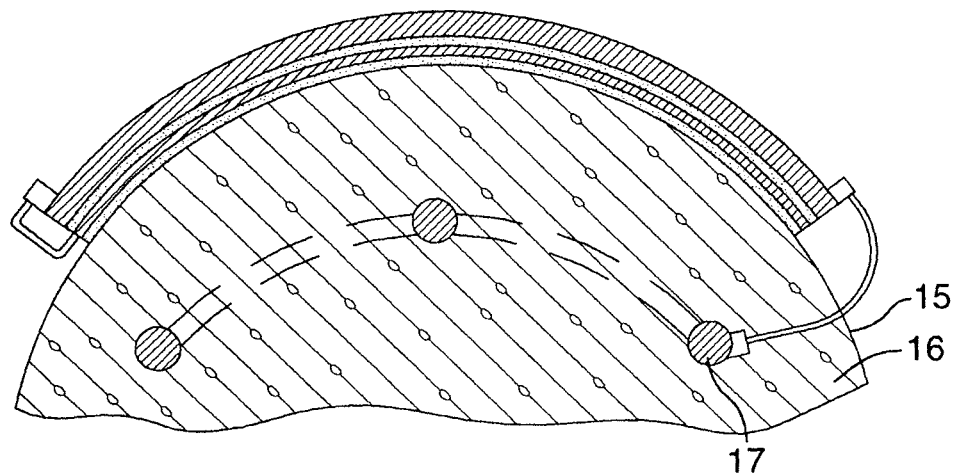
FIG. 1A is a cross-sectional view of the first anode assembly of FIG. 1 with the anode assembly installed on the concrete structure.

As shown in FIGS. 1 and 1A there is provided an anode assembly 9 defining a structure comprising from the top as shown: a solar panel 10; an adhesive material 11; an anode 12; an adhesive layer 13 and a removable protective covering 14.

The solar panel is formed of a flexible sheet and is designed for low light use. One suitable example has the following specifications:

PowerFilm® Low Light Series

The PowerFilm Low Light Series modules by Power Film Solar Inc of California USA provide energy collection at light levels as low as 200 lux, making them useful for almost any indoor environment.

| MODEL: | LL3-37 |
|---|---|
| Operating voltage | 2.7 V |
| Amps @ 1000 lux | 515 µA |
| Watts @ 1000 lux | 1.39 mW |
| Typical Voc | 3.5 V |
| Weight | 0.4 OZ (12 g) |
| Total size | 4.49 in × 1.45 in (114 mm × 36.5 mm) |

In this embodiment the anode is formed of a flexible material which contains a conductive material such as graphite or carbon so that the layer 12 is flexible and electrically conductive.

The anode is bonded to the rear surface of the flexible sheet forming the solar panel by a suitable adhesive. The structure thus formed is itself flexible. In this embodiment an adhesive layer is applied to the anode which is also of an ionically conductive material allowing the structure to be self-adhesively attached to the surface 15 of a concrete structure 16 containing reinforcing bars 17 to be cathodically protected. To protect the adhesive prior to application a removable sheet 14 covers the adhesive. Alternatively the anode material may be self-adhesive such that it may bond to the solar panel without need of a separate adhesive layer. Additional self-setting anode material in liquid or gel form may be used to adhere the assembly to the concrete surface.

The method herein therefore in this embodiment is for cathodically protecting and/or passivating a metal section in a material which is an ionically conductive concrete or mortar. The method includes providing the anode 12 for communication of an ionic current to the metal section 17 in the material 16 when the anode is electrically connected to the surface 15. The method further includes providing the solar panel 10 having two terminals 101 and 102 which generates a voltage according to the above specification across the terminals in response to incident light on the panel. The method may include a performance indicator to verify the unit is powered and providing protection to the metal section. The performance indicator may be a visual indicator such as an LED light.

In this embodiment during an initial manufacturing and supply stage, the terminal 101 of the solar panel is directly connected to the anode so that the structure is supplied with this connection established. This connection is preferably formed of an inert metal material to prevent undesirable corrosion of the connection. The connection is shown only schematically but can include a terminal block or pad on the solar panel to which a wire 104 is soldered or connected and an end of the wire is soldered or bonded to the anode, depending on the material from which it is formed.

The second terminal 102 provides a connector 103 typically in the form of a deformable wire attached to the terminal block or pad. At the installation site as shown in FIG. 1A the second terminal is connected to the metal section 17 by the wire 103 with the metal section typically providing connection to a series of individual reinforcing bars by internal connections within the material 16. Connection can be effected by wrapping or soldering or by clamping using methods known in the art.

Thus as shown in FIGS. 1 and 1A the solar panel and the anode are supplied for installation as a common unit pre-assembled and ready for attachment to the surface of the material 16. As shown in the embodiment of FIG. 1 the anode is formed wholly by the layer on the rear surface of the solar panel and there are no additional components to the anode. This provides the simplest form of the structure herein where the flexible structure formed by the combination of the anode and the solar panel can be self adhesively attached to the surface. That is, in FIG. 1 the anode is firstly attached to a surface of the material, which is applied as a layer on to the surface, following which the solar panel attached onto an exposed face of the anode layer. As shown in FIGS. 1 and 1A, the structure can be bent or flexed into a non-planar shape to conform to a non-planar surface, in this case a curved concrete column. That is in FIGS. 1 and 1A the solar panel and the anode are both flexible to conform to the required shape of the surface.

Figure 2:
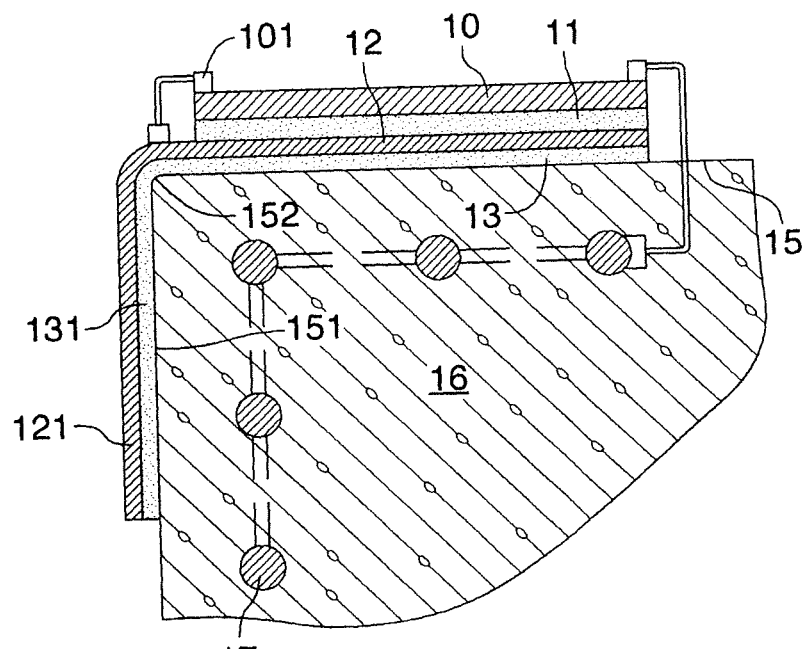
FIG. 2 is a cross-sectional view of a second anode assembly for use on a concrete reinforced structure in a corrosion protection method according to the present invention.

Turning now to FIG. 2, there is shown a similar arrangement to that of FIG. 1 where the anode layer 12 extends beyond the edge of the solar panel at least in one direction. This forms an extension portion 121 of the anode and its associated adhesive layer 131 which extends on the surface to a position 151 beyond a corner 152 of the concrete 16. In this embodiment it is possible that only the anode layer 12 is flexible since the solar panel is located at a flat portion of the surface 15 and only the anode traverses the corner 152.

Figure 3:
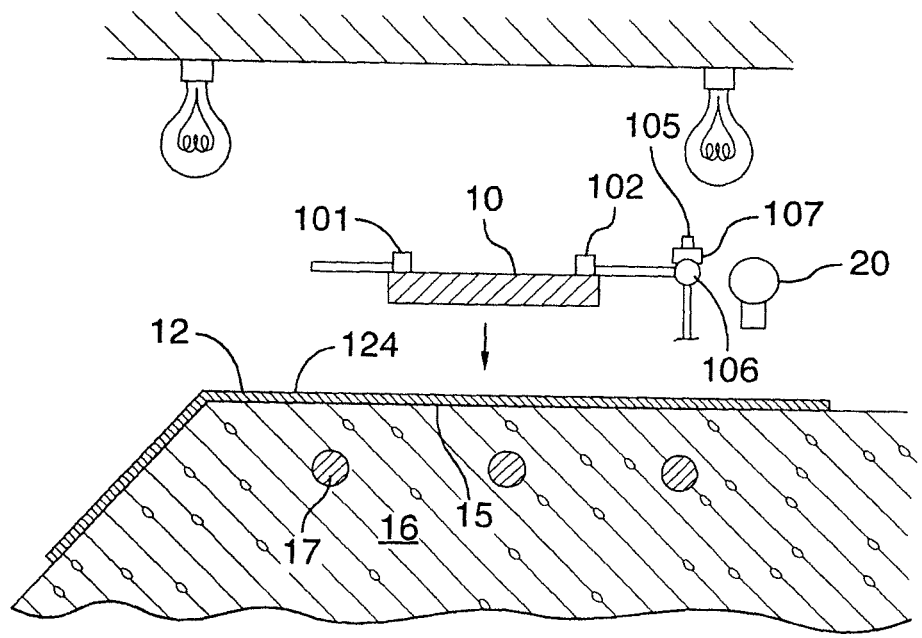
FIG. 3 is a cross-sectional view of a third anode assembly for use on a concrete reinforced structure shown during an assembly step in a corrosion protection method according to the present invention.

Turning now to FIG. 3, there is shown a further embodiment where the solar panel 10 is separate from the anode 12 when supplied on site. In this embodiment, an electrically conductive material 124 is applied onto the surface 15 to form the anode. This can be a conductive paint, adhesive, or other flexible conforming material which is typically supplied as a settable liquid or paste or powder or wire which can be metalized and applied as a layer to a shape and location as required in the design. In this embodiment, the solar panel is supplied as a separate component and is bonded to the layer of the material 124. This bonding action can use an adhesive effect of the material itself as it sets or can use a separate adhesive material. As the settable liquid or paste is supplied in an unset condition, it will be appreciated that the layer 124 can conform to any required shape around corners and onto different surfaces of the structure.

The terminals 101 and 102 are attached to the steel 17 and to the anode as set out above.

This embodiment allows the structure to be designed on site to meet technical requirements for the area of the anodes and the voltage and current to be supplied to them. Thus in this embodiment the anode includes a part which extends beyond a perimeter of the solar panel.

In this embodiment, the installer can particularly tailor the system to the location by using a light meter 20 to determine levels of ambient light in a location on the concrete 16 and using details of the concrete 16 and metal sections 17 within the structure at the specific location to calculate a required position and size of the anodes 12 to be applied and a position and number of the solar panels to be used to generate the required protective current.

The light meter is used to collect light intensity data in the area. The structural data includes the position and content of the reinforcing steel, the concrete condition, the corrosion condition of the steel and the desired level of future corrosion protection. These criteria are used to determine the location, number and size of solar panel or panels, the type and size of anode or anodes required and the number and size of energy storage devices if desired.

The method includes positioning and installing the solar panel or panels, the anode material, the energy storage device if desired and the connections to steel to be protected together with optionally monitoring the performance of the system.

The performance of the system may be monitored to confirm the system is performing property. Performance may be monitored manually or preferably the performance is monitored automatically without the need to take monitoring equipment to the installation site and without the need to disconnect the unit as this creates a situation where the unit may be left disconnected from the metal section when monitoring is complete. A preferred performance indicator is an LED light 105 which is powered when the system is on as detected by the voltage and/or current sensor 106. The light 105 may be on at all times when the system is operational or the light may be connected to a test circuit 107 such that the light is normally off, but is turned on during a test if the system is operational at that time.

This arrangement is particularly effective where the location is an indoor location without access to direct sunlight and instead uses artificial lighting 21 which is typically constant but of a low level. In this case the solar panel can be of the type and specification defined above which is arranged to generate sufficient voltage to mitigate corrosion, cathodically protect and/or passivate said metal section at low light less than 1000 lux.

Figure 4:
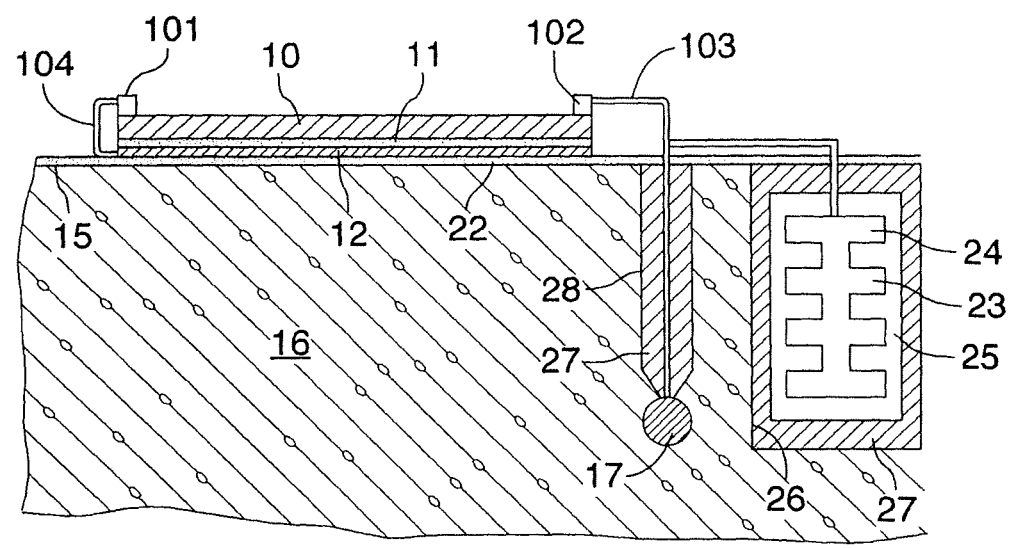
FIG. 4 is a cross-sectional view of a fourth anode assembly for use on a concrete reinforced structure in a corrosion protection method according to the present invention.

Turning now to FIG. 4, there is shown another embodiment where the solar panel 10 and the anode 12 are attached to the surface of the material by an ionically conductive adhesive material 22. In this embodiment the combined structure of the anode and solar panel connected by the adhesive 11 is supplied without any additional adhesive layer 13. In this embodiment a layer of a mortar, grout or other similar material is applied onto the surface 15 of a nature which connects to the anode when applied onto the layer 22. The layer 22 can extend beyond the region of the anode and may form a covering or protective or repair layer over the surface 15. That is the anode 12 forms the electrically conductive layer. Ions can communicate through the layer 22 and the material 16 to the steel 17.

Also shown in FIG. 4 is an arrangement in which there is provided, in addition to the part of the anode 12 connected to the surface 15 through the layer 22, an additional anode component 23. Typically this additional anode component comprises a sacrificial anode element 24 encased in a mortar casing 25 and embedded in an excavated hole 26 in material 16 which is backfilled with a grout 27. In this case therefore the additional anode component 23 comprises a sacrificial anode member arranged to supply galvanic voltage and current when the solar panel is not active.

The wire 103 is connected to the steel 17 through an excavated or drilled hole 28 from the surface to the rebar which again is backfilled with the material 27.

Suitable connection between the wires may be necessary to ensure proper current flow including diodes (not shown) well known to control the current in different circumstances depending on the corrosive state of the components.

Figure 5:
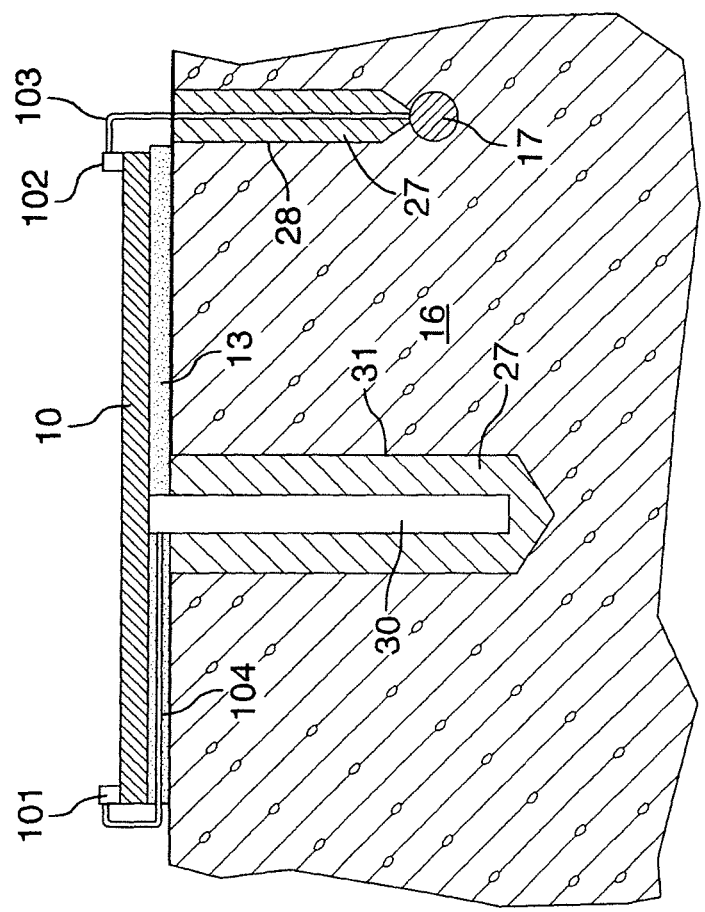
FIG. 5 is a cross-sectional view of a fifth anode assembly for use on a concrete reinforced structure in a corrosion protection method according to the present invention.

Turning now to FIG. 5 there is shown another embodiment where the anode 30 is provided not as a layer on the rear of the panel 10 but instead is a solid anode embedded in the material 16 in an excavated hole 31 and backfilled with material 27. The structure is supplied as a common unit including the solar panel 10 and the anode 30 for installation into the concrete. The solar panel is connected to the surface 15 using the adhesive 13. The wire extends from the terminal 101 to the anode 30 and may go through the adhesive 13.

Figure 6:
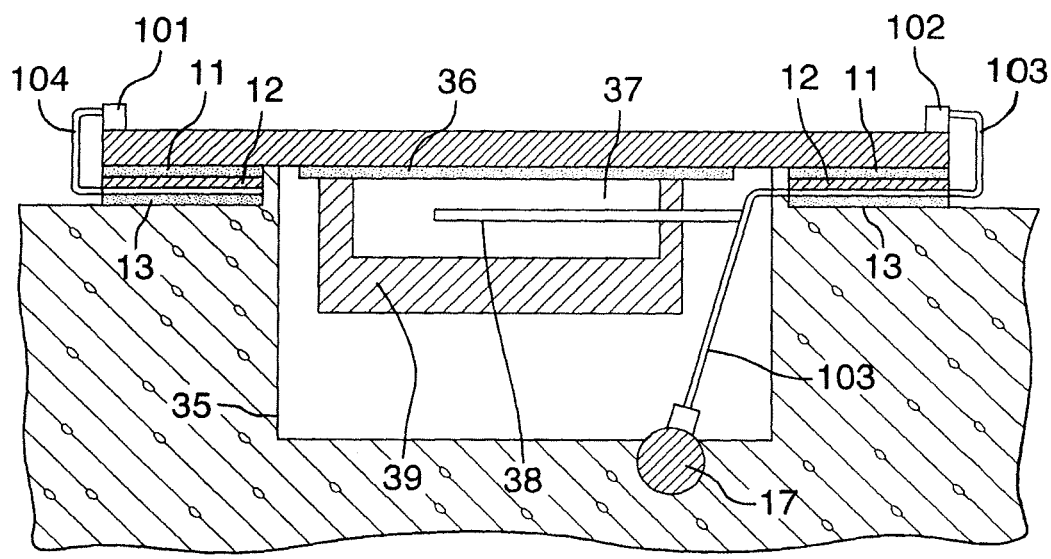
FIG. 6 is a cross-sectional view of a sixth anode assembly for use on a concrete reinforced structure in a corrosion protection method according to the present invention.

In FIG. 6 is shown a further alternative where the solar panel includes the above flat anode portion 12 together with an additional sacrificial anode body 37 attached to the underside of the panel 10 by an adhesive layer 36. In this case the anode body 37 is covered by a porous mortar matrix 39 inserted in an excavated hole 35. A wire 38 from the anode body 37 is connected via the wire 103 to the steel 17.

Figure 7:
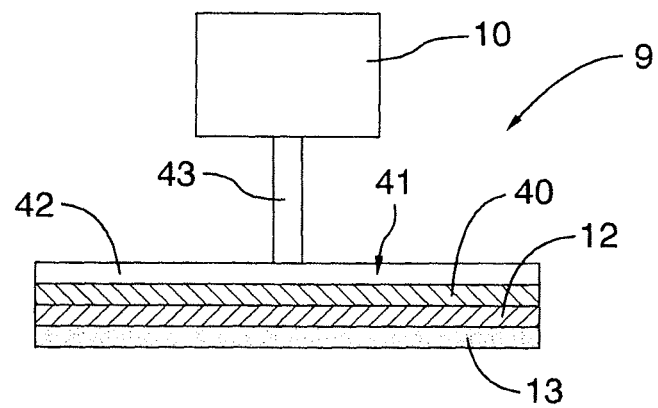
FIG. 7 is a cross-sectional view of a seventh anode assembly for use on a concrete reinforced structure in a corrosion protection method according to the present invention.

In FIG. 7 there is provided a storage device 40 as part of the common unit 9 located as a flat panel between the anode 12 and the solar panel 10. The storage device can comprise a cell or a capacitor as previously described and may be in a flat pack form with the anode directly applied to the underside. The storage device may be applied to or adhered to both the solar panel and the anode (not shown).

Further in this embodiment, the solar panel 10 is mounted on a bracket 41 with a flat base 42 on top of the storage device 40 and an upstanding leg 43 which can position the solar panel at a required angle relative to the flat base 42 to better use the light source available.

Experimental Results

To evaluate the concept, 18" by 18" by 8" thick reinforced concrete slabs were cast. Each slab contained 8 by 20 mm diameter steel reinforcing bars. The slabs were cast in two pours using bagged concrete. The first pour was four inches thick and included the bottom 4 bars. This pour used a normal bagged concrete mix. The second pour was four inches thick and included the top four bars. The concrete used for the second pour was bagged concrete however; it had 10 lbs/yd3 of salt (sodium chloride) added to the mix. All the bars are electrically connected to create a corrosion cell between the top and bottom bars.

On the first block a flexible, low light solar panel (Powerfilm® LL3-37) of dimensions (36.5 mm×114 mm) with electrically conductive carbon filled anode (DAC-Anode®) applied to the back side was affixed to the surface of the block using additional electrically conductive carbon filled anode material. The surface area of contact between the anode material and the concrete was the same as the area of the solar panel. The electrically conductive anode material was electrically connected to the positive terminal of the solar panel. The negative terminal of the solar panel was electrically connected to the reinforcing steel to be protected. The slabs were exposed to variable light intensities and the current output was measured. The light intensity and current is shown in the table below.

| Lux (light intensity) | Current (microamps) |
|---|---|
| 55 | 6.6 |
| 95 | 10.2 |
| 150 | 11.4 |
| 200 | 12.8 |
| 300 | 16.9 |
| 500 | 20.3 |
| 750 | 22.4 |
| 1000 | 23.6 |
| 1500 | 25.5 |
| 2000 | 26.4 |
| 5000 | 29.3 |
| 10000 | 31.7 |
| 15000 | 33 |

A second block was constructed similar to the first block above. Installation was completed as follows; A first layer of electrically conductive anode (DAC-Anode®) material was applied to a 12" by 12" area of the block. After this coating was cured, the solar panel (same type and dimensions as solar panel used on the first block) was directly affixed to the concrete surface using additional electrically conductive anode material (no anode material was pre-installed on the back side of the flexible solar panel. Electrical connection between the anode and the positive terminal of the solar panel was made using electrically conductive anode material. Again, the negative terminal of the solar panel was electrically connected to the reinforcing steel to be protected. The slabs were exposed to variable light intensities and the current output was measured. The light intensity and current is shown in the table below.

| Lux | Current (microamps) |
|---|---|
| 55 | 8.1 |
| 95 | 11.4 |
| 150 | 26.3 |
| 200 | 35.9 |
| 300 | 36.4 |
| 500 | 57.5 |
| 750 | 182.7 |
| 1000 | 230.5 |
| 1500 | 308.1 |
| 2000 | 372 |
| 3000 | 455 |
| 5000 | 591 |
| 10000 | 731 |
| 15000 | 772 |

On a further block four flexible, low light solar panel (Powerfilm® LL3-37) of dimensions (36.5 mm×114 mm) with electrically conductive carbon filled anode (DAC-Anode®) applied to the back side was affixed to the surface of the block using additional electrically conductive carbon filled anode material. The surface area of contact between the anode material and the concrete was the same as the area of the solar panel. The electrically conductive anode material was electrically connected to the positive terminal of the solar panel. The negative terminal of the solar panel was electrically connected to the reinforcing steel to be protected. The slabs were exposed to variable light intensities and the current output was measured. The light intensity and current is shown in the table below.

| Lux | Current (microamps) |
|---|---|
| 50 | 50.6 |
| 100 | 168.2 |
| 150 | 176 |
| 200 | 240.1 |
| 300 | 326 |
| 600 | 754 |
| 1000 | 1433 |
| 4000 | 2927 |

Since various modifications can be made in my invention as herein above described, and many apparently widely different embodiments of same may be made within the spirit and scope of the claims without department from such spirit and scope, it is intended that all matter contained in the accompanying specification shall be interpreted as illustrative only and not in a limiting sense.

The invention claimed is:

1. A method for cathodically protecting and/or passivating a metal section in a concrete or mortar material which is ionically conductive, where the metal section is located within the concrete or mortar material at a location spaced from a surface of the concrete or mortar material, the method comprising:
    applying to the surface of the concrete or mortar material an anode material which is conductive of electrons;
    the anode material comprising a conformable adhesive so that the anode material conforms to the surface and attaches to the surface by the conformable adhesive of the anode material;
    providing a solar panel having a front surface through which solar energy passes, a rear surface, a positive terminal and a negative terminal and components of the solar panel located between the front surface and the rear surface which cause electrons to be transmitted between-the positive and negative terminals in response to solar energy on the front surface;
    adhesively attaching the rear surface of the solar panel to the conformable adhesive of the anode material so that the rear surface of the solar panel is attached to the surface of the concrete or mortar material by the anode material;
    providing an ionic connection through the concrete or mortar material from the anode material to the metal section;
    the positive terminal of the solar panel being connected to the anode material directly or indirectly by a first electrical conductor connected to the positive terminal;
    and connecting the negative terminal of the solar panel directly or indirectly to the metal section by a second electrical conductor connected to the negative terminal such that corrosion of the metal section is reduced or halted;
    wherein said electrons transmitted by the solar panel pass between the anode material and the positive terminal through the first electrical conductor and not through the rear surface of the solar panel.

2. The method according to claim 1 wherein at least part of the solar panel is flexible.

3. The method according to claim 1 wherein the solar panel is attached to the anode material subsequent to application of the anode material to the surface.

4. The method according to claim 1 wherein in the anode material and the solar panel form components of a common preassembled unit where said positive terminal of the solar panel is connected to the anode material.

5. The method according to claim 1 wherein at least a part of the anode material lies along and is directly connected by said conformable adhesive to said rear surface of the solar panel.

6. The method according to claim 1 including flexing said solar panel to conform to a non-planar shape of a surface of the concrete or mortal material.

7. The method according to claim 1 wherein the anode material includes a part which extends beyond a perimeter of the solar panel.

8. The method according to claim 1 wherein in addition to a part of the anode material connected to a surface of the concrete or mortar material there is provided an additional anode component.

9. The method according to claim 8 wherein the additional anode component is at least partially embedded in the concrete or mortar material.

10. The method according to claim 1 wherein the solar panel is arranged to generate sufficient voltage and/or current to mitigate corrosion or provide cathodic protection to said metal section at low light less than 1000 lux.

11. The method according to claim 1 wherein the solar panel is provided at a location which is an indoor location without access to direct sunlight.

12. The method according to claim 1 including using a light meter to determine levels of ambient light in a location on the concrete or mortar material and using details of the concrete or mortar material and metal section at the location to calculate a required location and size of the solar panels and the anode material.

13. The method according to claim 1 including monitoring performance of the anode material and solar panel by a device which is connected to at least one of the anode material and the solar panel.

* * * * *